United States Patent
Gardner et al.

(10) Patent No.: US 11,410,888 B2
(45) Date of Patent: Aug. 9, 2022

(54) METHOD OF MAKING 3D CMOS WITH INTEGRATED CHANNEL AND S/D REGIONS

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/927,462

(22) Filed: Jul. 13, 2020

(65) Prior Publication Data

US 2021/0175128 A1    Jun. 10, 2021

Related U.S. Application Data

(60) Provisional application No. 62/944,942, filed on Dec. 6, 2019.

(51) Int. Cl.
*H01L 21/8238* (2006.01)
*H01L 29/775* (2006.01)
(Continued)

(52) U.S. Cl.
CPC ........ *H01L 21/823821* (2013.01); *H01L 21/02603* (2013.01); *H01L 21/0337* (2013.01); *H01L 21/823807* (2013.01); *H01L 21/823814* (2013.01); *H01L 21/823828* (2013.01); *H01L 27/0922* (2013.01); *H01L 29/66795* (2013.01); *H01L 29/775* (2013.01); *H01L 29/7851* (2013.01)

(58) Field of Classification Search
CPC .......... H01L 21/02603; H01L 21/0337; H01L 21/823412; H01L 21/823418; H01L 21/823431; H01L 21/823437; H01L 21/823807; H01L 21/823814; H01L 21/823821; H01L 21/823828; H01L 21/845; H01L 27/0886; H01L 27/0922; H01L 27/0924; H01L 27/10879; H01L 27/1211; H01L 29/0665; H01L 29/0669; H01L 29/0673; H01L 29/0843; H01L 29/41791; H01L 29/66439; H01L 29/66795; H01L 29/775; H01L 29/7848; H01L 29/785; H01L 29/7851; H01L 29/7853; H01L 29/7855; H01L 2029/7858
See application file for complete search history.

(56) References Cited

U.S. PATENT DOCUMENTS 10,236,217 B1 *  3/2019  Ando ............... H01L 29/66545
10,304,833 B1 *  5/2019  Suvarna ............ H01L 29/1037
(Continued)

*Primary Examiner* — David C Spalla
(74) *Attorney, Agent, or Firm* — Oblon, McClelland, Maier & Neustadt, L.L.P.

(57) ABSTRACT

Techniques herein include methods for fabricating high density logic and memory for advanced circuit architecture. The methods can enable higher density circuits to be produced at reduced cost. The methods can include growth of channel regions and S/D regions for NMOS devices using a first same nano-sheet in a nano-sheet stack. Similarly, the methods can include growth of channel regions and S/D regions for PMOS devices using a second same nano-sheet in the nano-sheet stack. The resulting 3D CMOS stack can include integrated channel and S/D regions.

20 Claims, 22 Drawing Sheets

(51) Int. Cl.
*H01L 29/78* (2006.01)
*H01L 27/092* (2006.01)
*H01L 21/033* (2006.01)
*H01L 21/02* (2006.01)
*H01L 29/66* (2006.01)

(56) References Cited

U.S. PATENT DOCUMENTS

| | | | | |
|---|---|---|---|---|
| 2019/0097011 A1* | 3/2019 | Wu | ........................ | H01L 27/092 |
| 2019/0172755 A1* | 6/2019 | Smith | ................ | H01L 29/42376 |
| 2020/0118892 A1* | 4/2020 | Cheng | ............... | H01L 29/66439 |

* cited by examiner

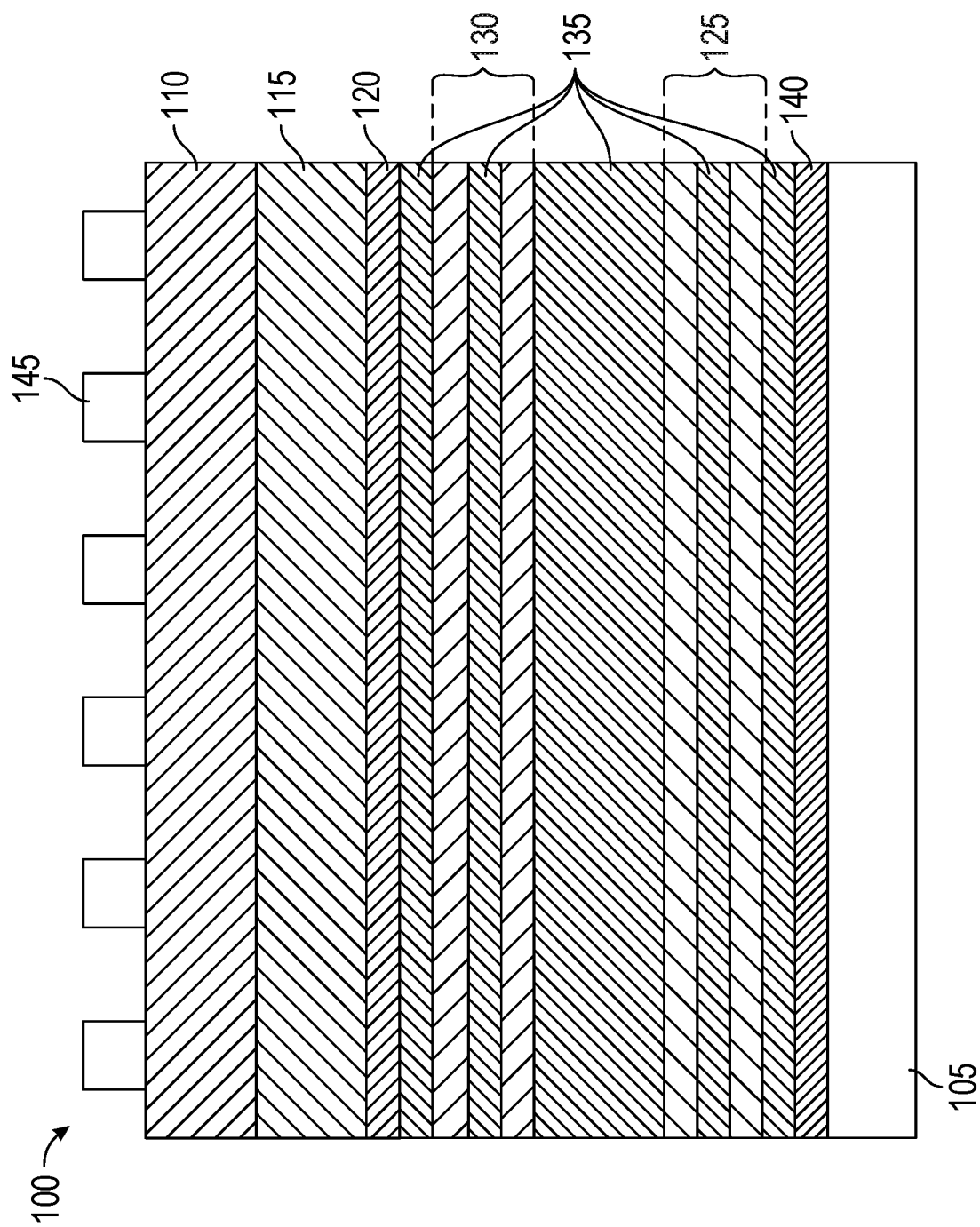
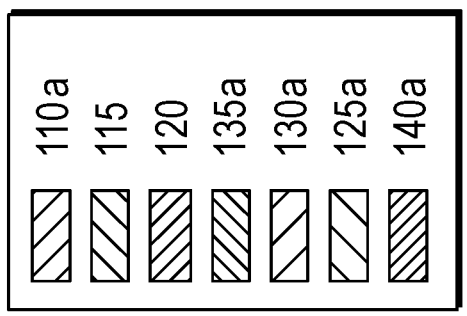
FIG. 2

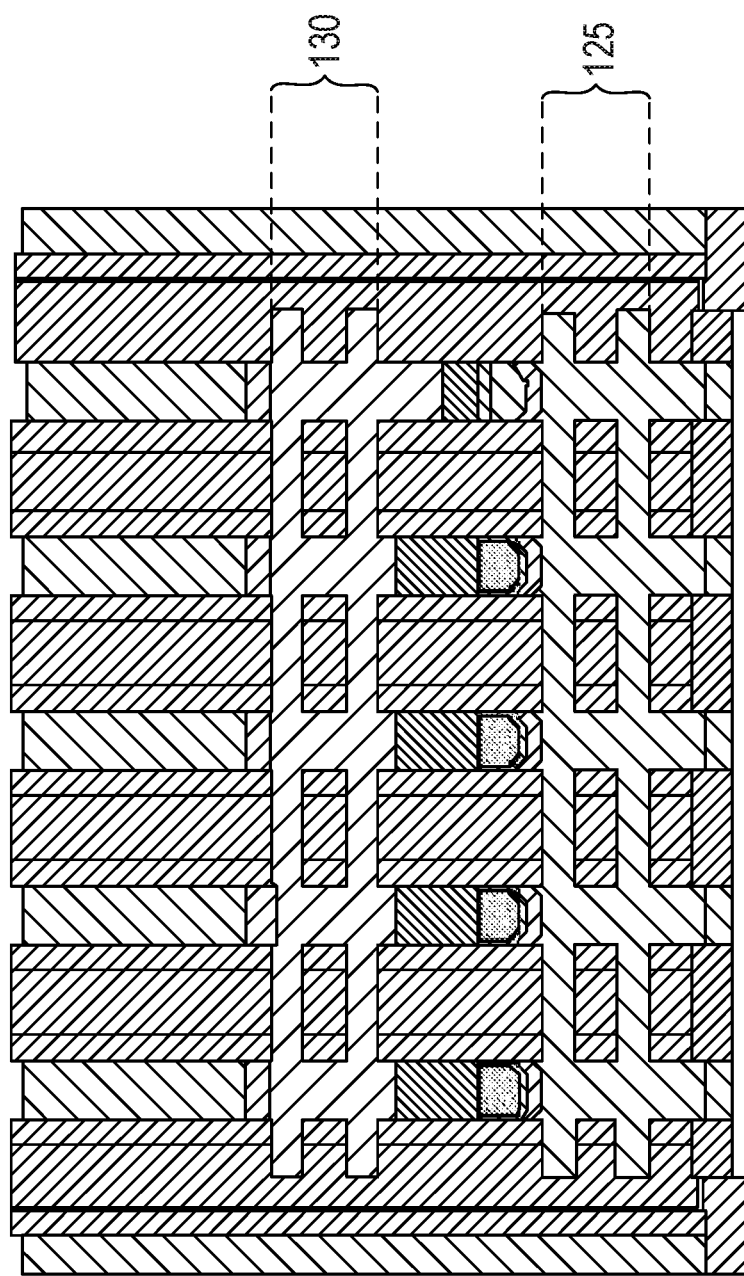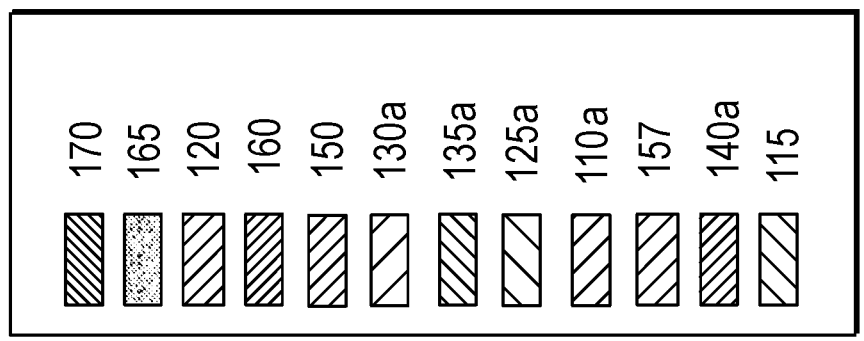
FIG. 14

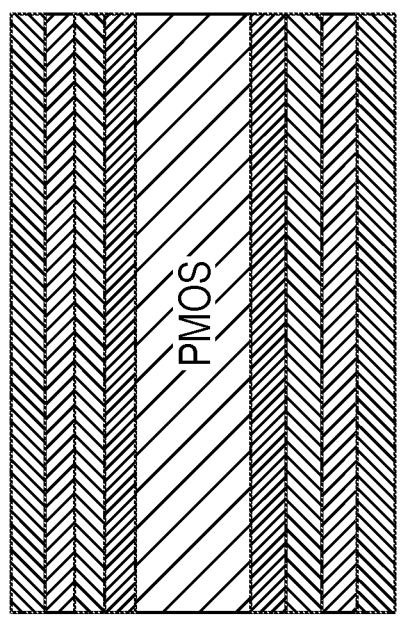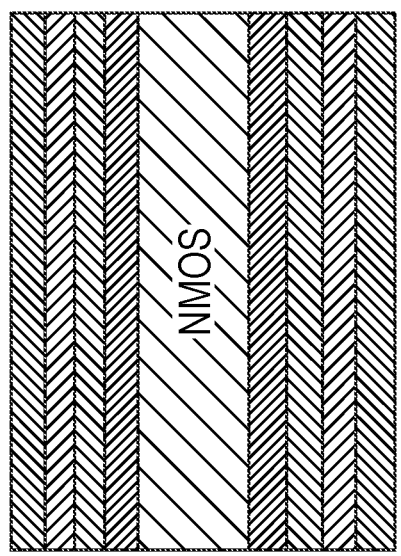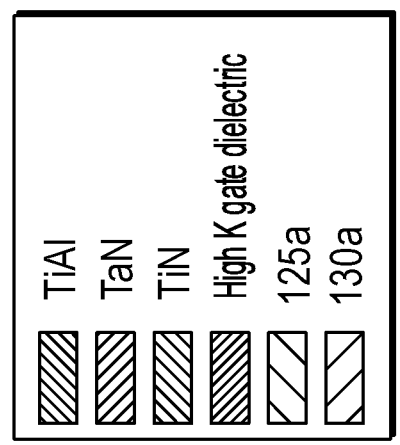
FIG. 17

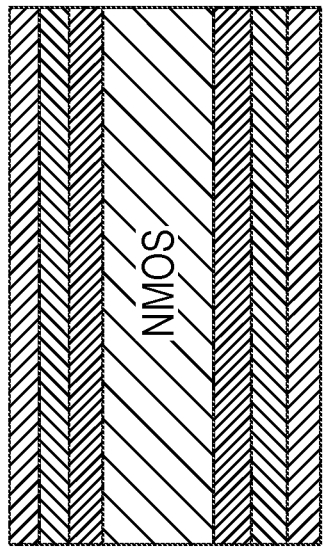
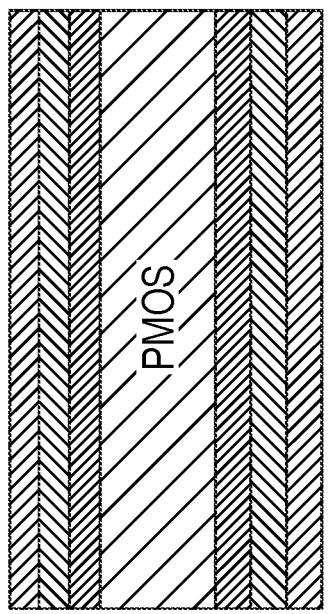
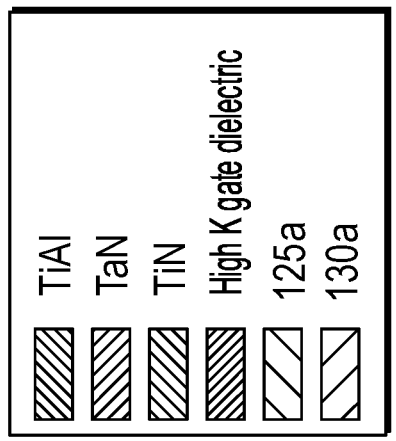
FIG. 20

METHOD OF MAKING 3D CMOS WITH INTEGRATED CHANNEL AND S/D REGIONS

CROSS REFERENCE TO RELATED APPLICATIONS

This present disclosure claims the benefit of U.S. Provisional Application No. 62/944,942, filed on Dec. 6, 2019, which is incorporated herein by reference in its entirety.

FIELD OF THE INVENTION

The present disclosure relates to a method of fabrication for integrated circuits and microelectronic devices, in particular a method of fabricating 3D CMOS that utilizes a common doping level for S/D and channel regions.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration is seen as a viable option to continue semiconductor scaling. As the contacted gate pitch reaches its scaling limit due to manufacturing variability and electrostatic device limitations, 2D transistor density scaling stops.

3D integration, i.e. the vertical stacking of multiple devices, aims to overcome these scaling limitations by increasing transistor density in volume rather than area. Complementary metal oxide semiconductor (CMOS) very-large-scale integration (VLSI) scaling, as used for example in CPU or GPU products, is exploring adoption of 3D integration as a primary means of moving the semiconductor roadmap forward, and thus desires enabling technologies. One such technology can include enhanced three-dimensional CMOS that uses a common doping level for source/drain (S/D) and channel regions to enable higher density circuits to be produced at reduced cost. Channel scaling can be enabled because channel and S/D can be the same material, and having a large drive current (IDsat) is possible with techniques described herein using a gate-all-around (GAA) device.

SUMMARY

The present disclosure relates to a method of fabricating a semiconductor device, including: forming a nano-sheet stack on a surface of a substrate, the nano-sheet stack including a first portion formed from a first channel material and disposed proximal to the substrate, the first channel material being doped with a first dopant, and the first portion including at least one layer of the first channel material, a second portion formed from a second channel material and disposed vertically above the first portion, the second channel material being doped with a second dopant, and the second portion including at least one layer of the second channel material, and a bulk portion formed from a bulk material and disposed between the first portion and the second portion; depositing a mask overtop the nano-sheet stack; etching the nano-sheet stack to form multilayer sub-stacks defined by the mask, each stack of the multilayer sub-stacks including the first portion having uncovered sidewalls of the first channel material and the second portion having uncovered sidewalls of the second channel material; growing a first source/drain region at ends of the first channel material in the first portion, the first source/drain region being doped based on the first dopant; growing a second source/drain region at ends of the second channel material in the second portion, the second source/drain region being doped based on the second dopant; forming a first gate stack on the first source/drain region at ends of the first channel material in the first portion, the first gate stack including at least one layer of a first gate material; forming a second gate stack on the second source/drain region at ends of the second channel material in the second portion, the second gate stack including at least one layer of a second gate material; depositing an organic planarization layer to at least cover the first gate stack on the first source/drain region; recessing the organic planarization layer to uncover the second gate stack on the second source/drain region; and removing a layer of the at least one layer of the second gate material of the second gate stack.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 2 is a cross-sectional view of a nano-sheet stack prior to etching, according to an embodiment of the present disclosure.

FIG. 14 is a cross-sectional view of a nano-sheet stack after channel release, according to an embodiment of the present disclosure.

FIG. 17 is a cross-sectional view of a gate stack, according to an embodiment of the present disclosure.

FIG. 20 is a cross-sectional view of a gate stack after TiAl removal, according to an embodiment of the present disclosure.

DETAILED DESCRIPTION

Figure 1:
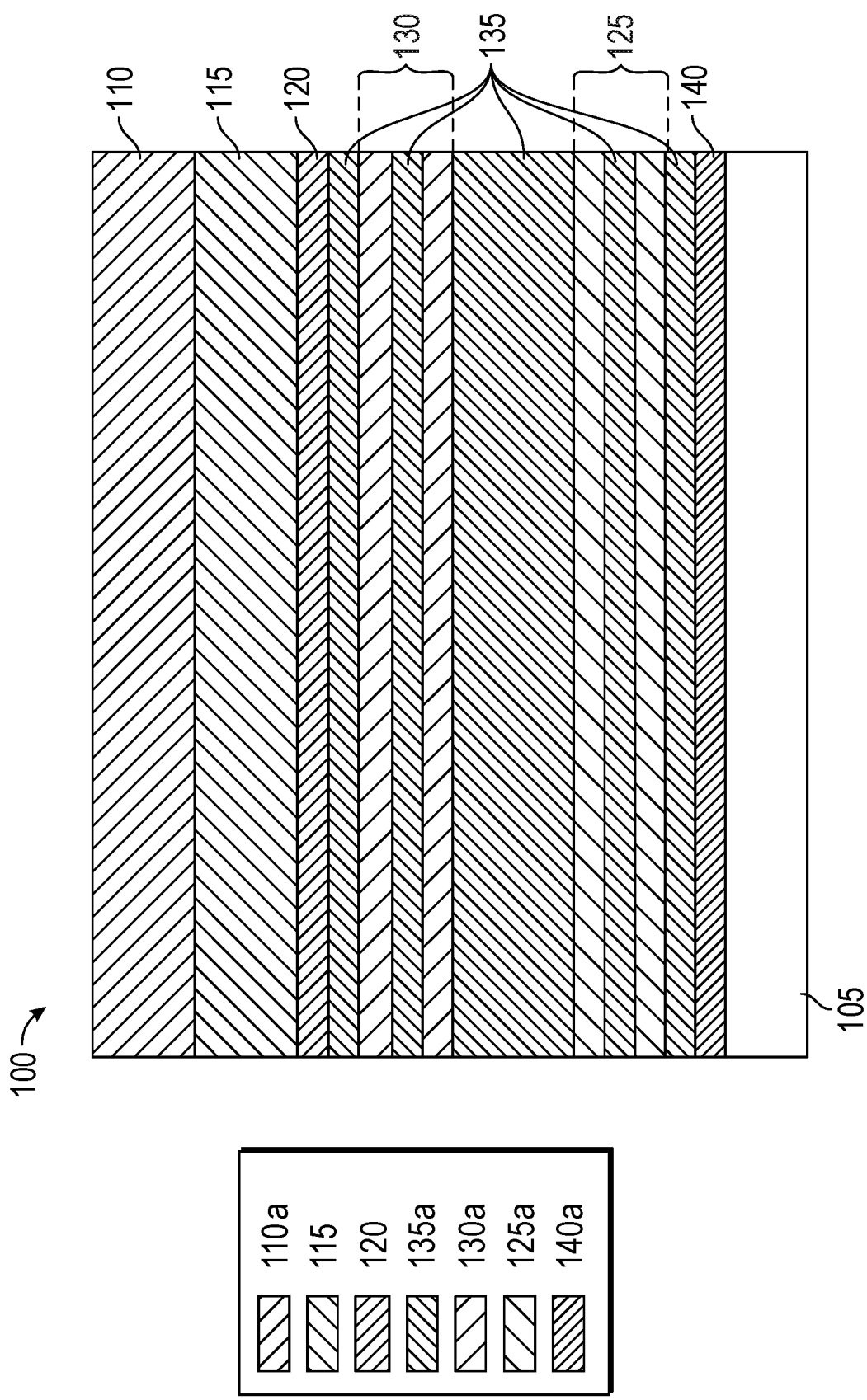
FIG. 1 is a cross-sectional view of a nano-sheet stack, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein include methods for making three-dimensional (3D) complementary metal oxide semiconductor (CMOS) devices with integrated channel and source/drain (S/D) regions. A 3D CMOS device can be fabricated as described herein by utilizing a common doping level for the S/D and channel regions in a 3D architecture. N+ channels and N+ S/D regions can be grown epitaxially and obtained by a same nano-sheet stack for NMOS devices. P+ channels and P+ S/D regions can be grown epitaxially and obtained by the same nano-sheet stack used for PMOS devices. Advantages include reducing the number of process steps to fabricate the 3D CMOS and 3D logic, enabling channel scaling by having the channel and S/D share the same material, and the 3D devices having a low sub-threshold swing (SS), low off state leakage (Idoff), robust drain saturation current (IDsat), and improved threshold voltage (Vt) control.

Example embodiments will now be described with reference to the drawings. Note that N=4 nano-sheets are shown in the example with NMOS over PMOS. However, it may be appreciated that any number greater than four nano-sheets can be selected in other embodiments.

FIG. 1 is a cross-sectional view of a nano-sheet stack 100, according to an embodiment of the present disclosure. In an embodiment, the nano-sheet stack 100 can be formed by using epitaxial growth to form multiple different layers of semiconductor material on a substrate 105. For example, materials for the different layers can include SiGe65, SiGe, SiB, SiGeB, SiP, among others. The layers can alternate and include dopants. Furthermore, predetermined layers that alternate, or predetermined layers that surround a target layer, can be designed to be removed and replaced. As shown, the nano-sheet stack 100 can include a cap disposed at the top of the nano-sheet stack 100. For example, the cap can include a nitride layer 110, a polysilicon layer 115, and an oxide layer 120, wherein the nitride layer 110 is disposed over top the polysilicon layer 115 and the polysilicon layer 115 is disposed over top the oxide layer 120. The nano-sheet stack 100 can also include a first epi region 125 formed from a first epi material 125a, a second epi region 130 formed from a second epi material 130a, bulk fin layers 135 formed from a bulk fin material 135a, and a low k layer 140 formed from a low k material 140a. The epi regions can also be referred to as channel regions. In an example, the first epi region 125 can be p-type and include two layers, the two layers of the first epi region 125 being separated from the low k layer 140 by a first layer of the bulk fin layers 135, and the two layers being separated from each other by a second layer of the bulk fin layers 135. The second epi region 130 can be n-type and include two layers, the two layers of the second epi region 130 being separated from the first epi region 125 by a third layer of the bulk fin layers 135. A fourth layer of the bulk fin layers 135 can separate the two layers of the second epi region 130. A fifth layer of the bulk fin layers 135 can separate the second epi region 130 from the oxide layer 120. The first epi material 125a can be, for example, Si or SiGe with boron doping to form SiB or SiGeB to result in PMOS for both source/drain (S/D) and channel regions. The second epi material 130a can be, for example, Si doped with phosphorous or SiP to result in NMOS for both S/D and channel regions. The bulk fin material 135a can be, for example, SiGe.

FIG. 2 is a cross-sectional view of the nano-sheet stack 100 prior to etching, according to an embodiment of the present disclosure. In an embodiment, a mask 145 can be formed overtop the nitride layer 110. In an example, the mask 145 can be a photoresist material that can be deposited and patterned, wherein the pattern can determine the channel regions.

Figure 3:
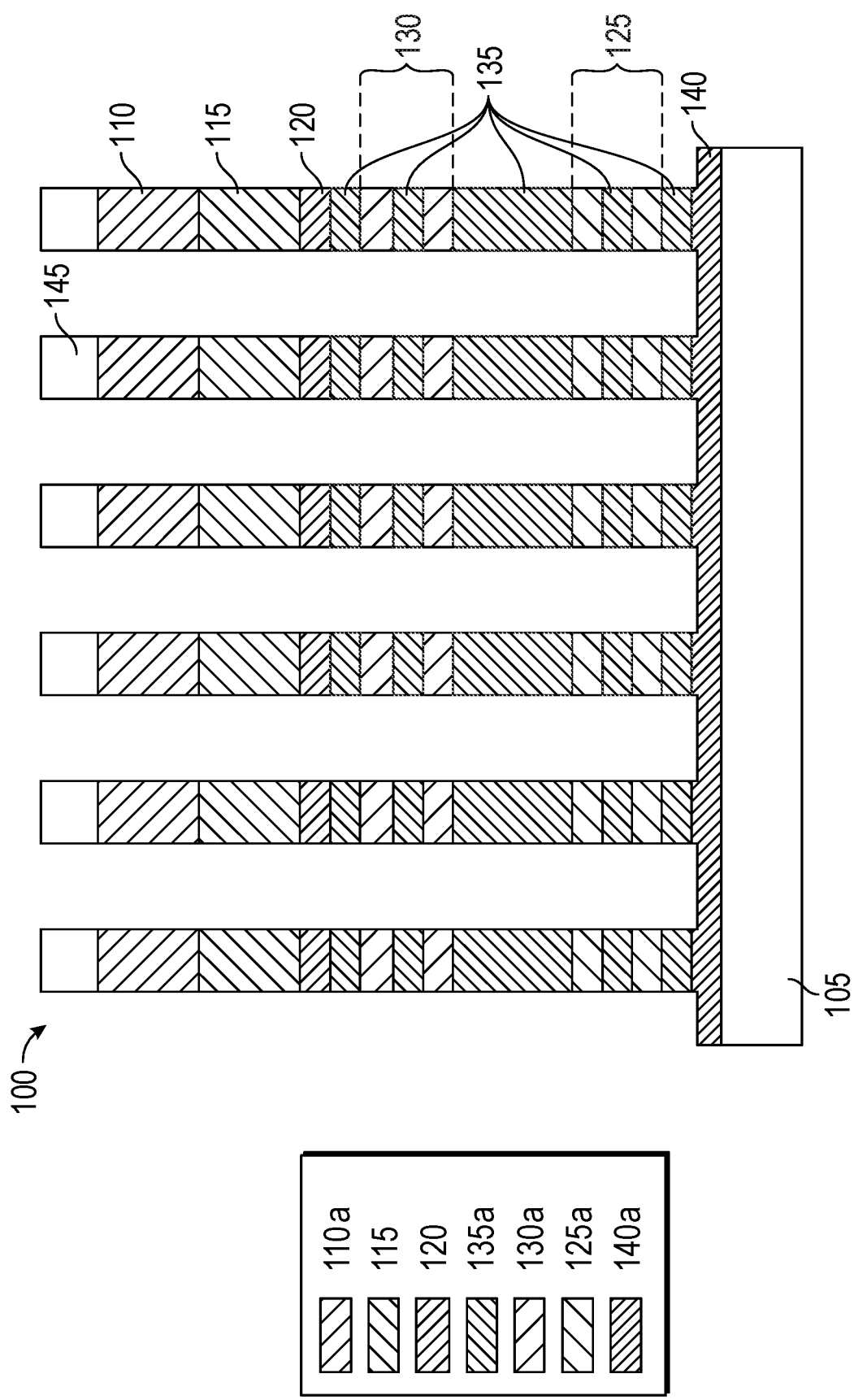
FIG. 3 is a cross-sectional view of a nano-sheet stack after etching, according to an embodiment of the present disclosure.

FIG. 3 is a cross-sectional view of the nano-sheet stack 100 after etching, according to an embodiment of the present disclosure. In an embodiment, the nano-sheet stack 100 can be etched down to the low k layer 140, resulting in multiple multilayer sub-stacks for the nano-sheet stack 100. For example, the multilayer sub-stacks can be fin shaped.

Figure 4:
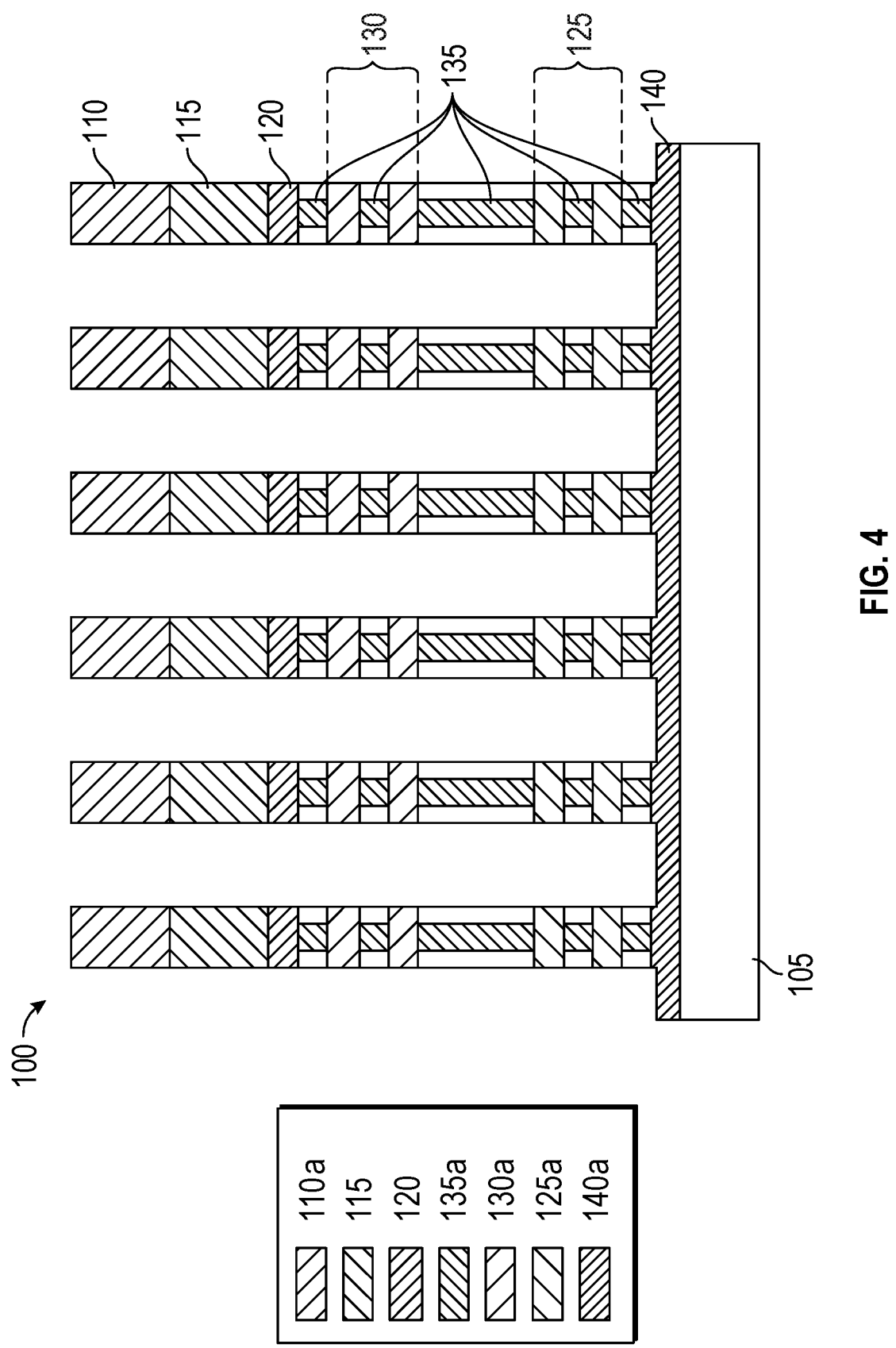
FIG. 4 is a cross-sectional view of a nano-sheet stack after removing a mask, according to an embodiment of the present disclosure.

FIG. 4 is a cross-sectional view of the nano-sheet stack 100 after removing the mask 145, according to an embodiment of the present disclosure. In an embodiment, the mask 145 can be removed, for example via a developer. Furthermore, an etch of the bulk fin layers 135 can be executed to laterally recess the bulk fin material 135a.

Figure 5:
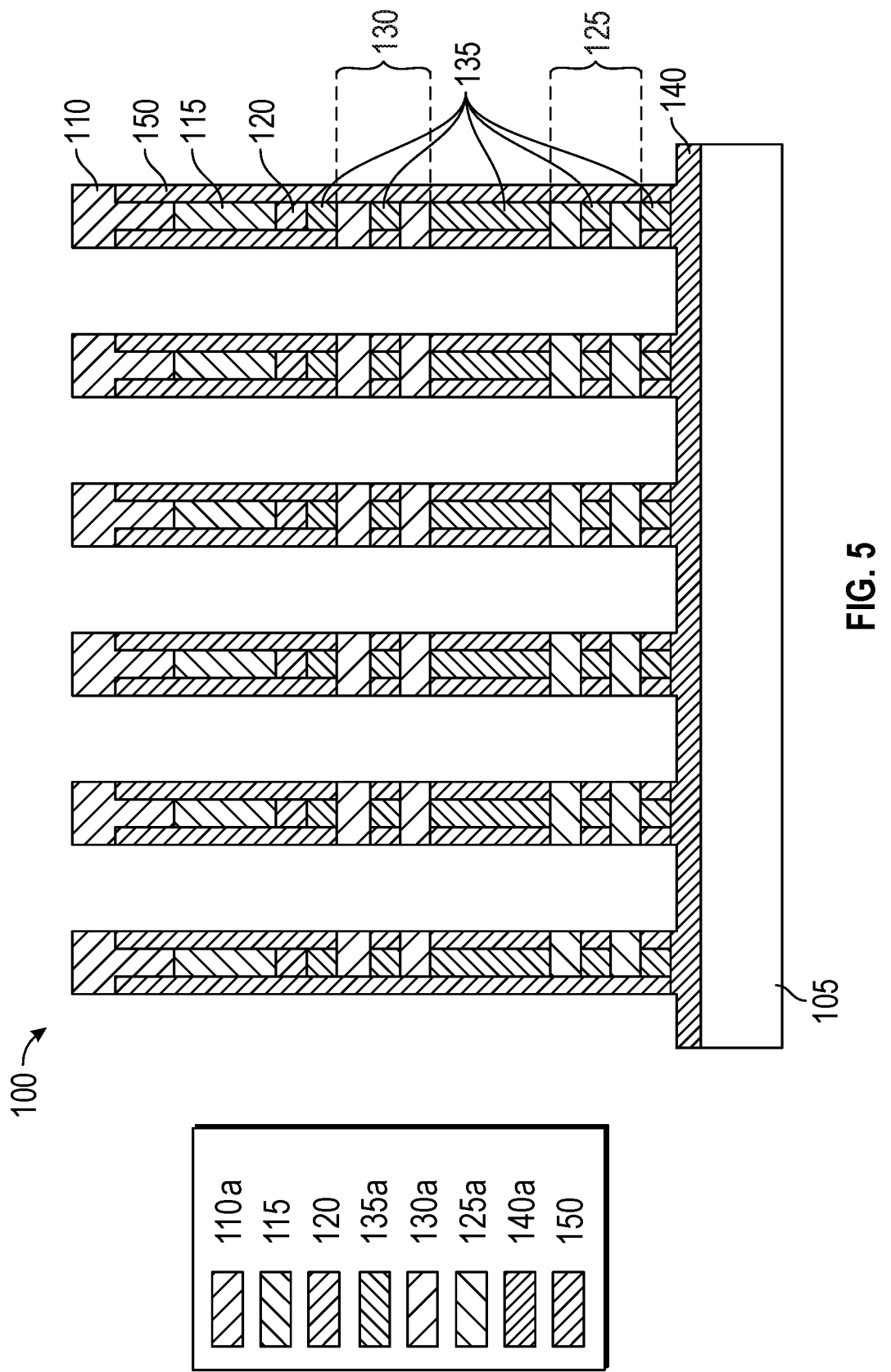
FIG. 5 is a cross-sectional view of a nano-sheet stack after filling in laterally recessed bulk fin layers, according to an embodiment of the present disclosure.

FIG. 5 is a cross-sectional view of the nano-sheet stack 100 after filling in the laterally recessed bulk fin layers 135, according to an embodiment of the present disclosure. In an embodiment, a low dielectric constant material can be deposited, such as SiOC 150, followed by an etch. The etch can be self-aligned to the existing nitride layer 110 and the polysilicon layer 115 to remove the SiOC 150 where not masked by the nitride layer 110 and the polysilicon layer 115, thus leaving the SiOC 150 in the recessed portion of the bulk fin layers 135.

Figure 6:
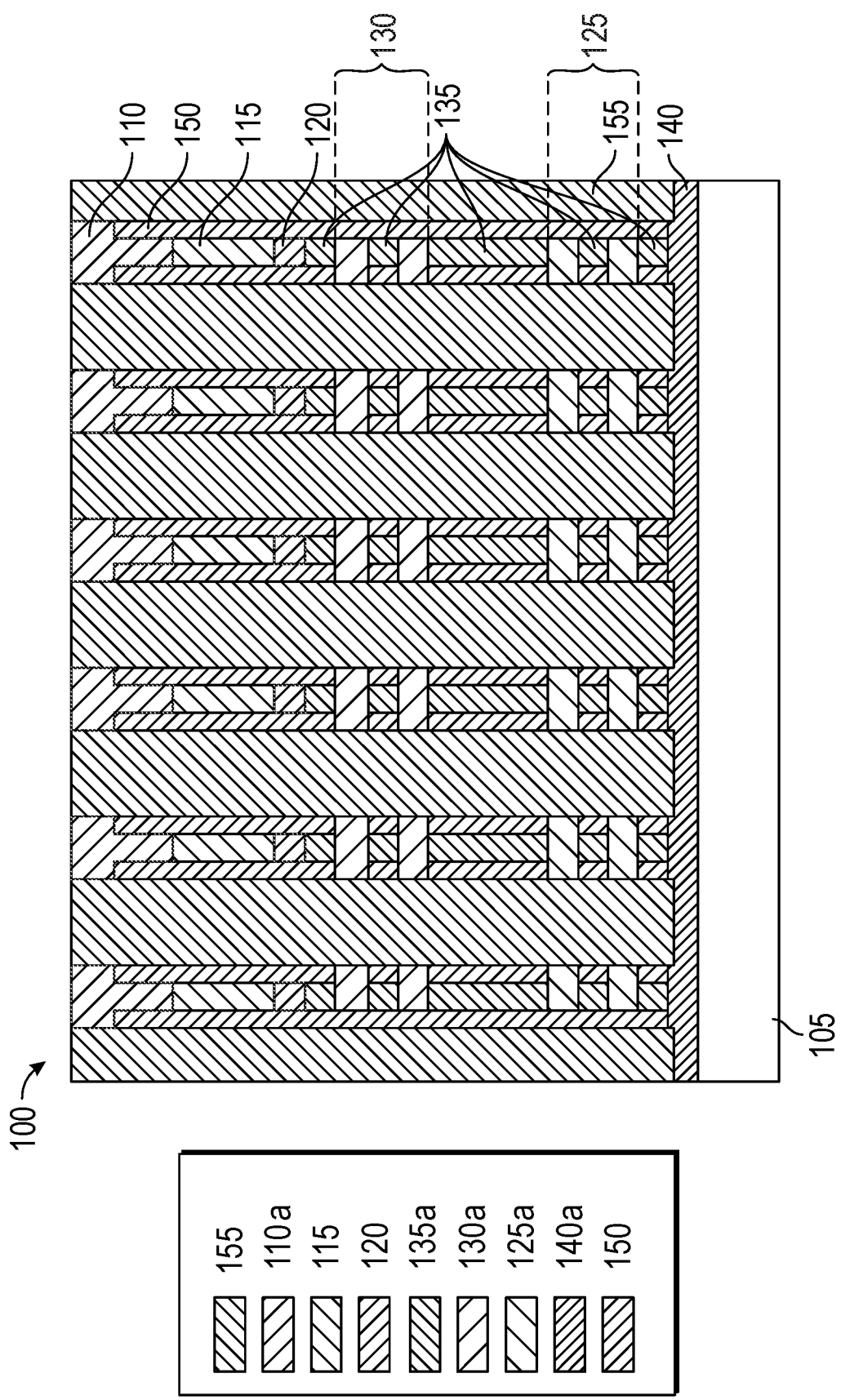
FIG. 6 is a cross-sectional view of a nano-sheet stack after filling in with a dielectric, according to an embodiment of the present disclosure.

FIG. 6 is a cross-sectional view of the nano-sheet stack 100 after filling in with a dielectric 155, according to an embodiment of the present disclosure. In an embodiment, the dielectric 155 can be deposited to fill in between the structures and planarized via a chemical mechanical polish (CMP).

Figure 7:
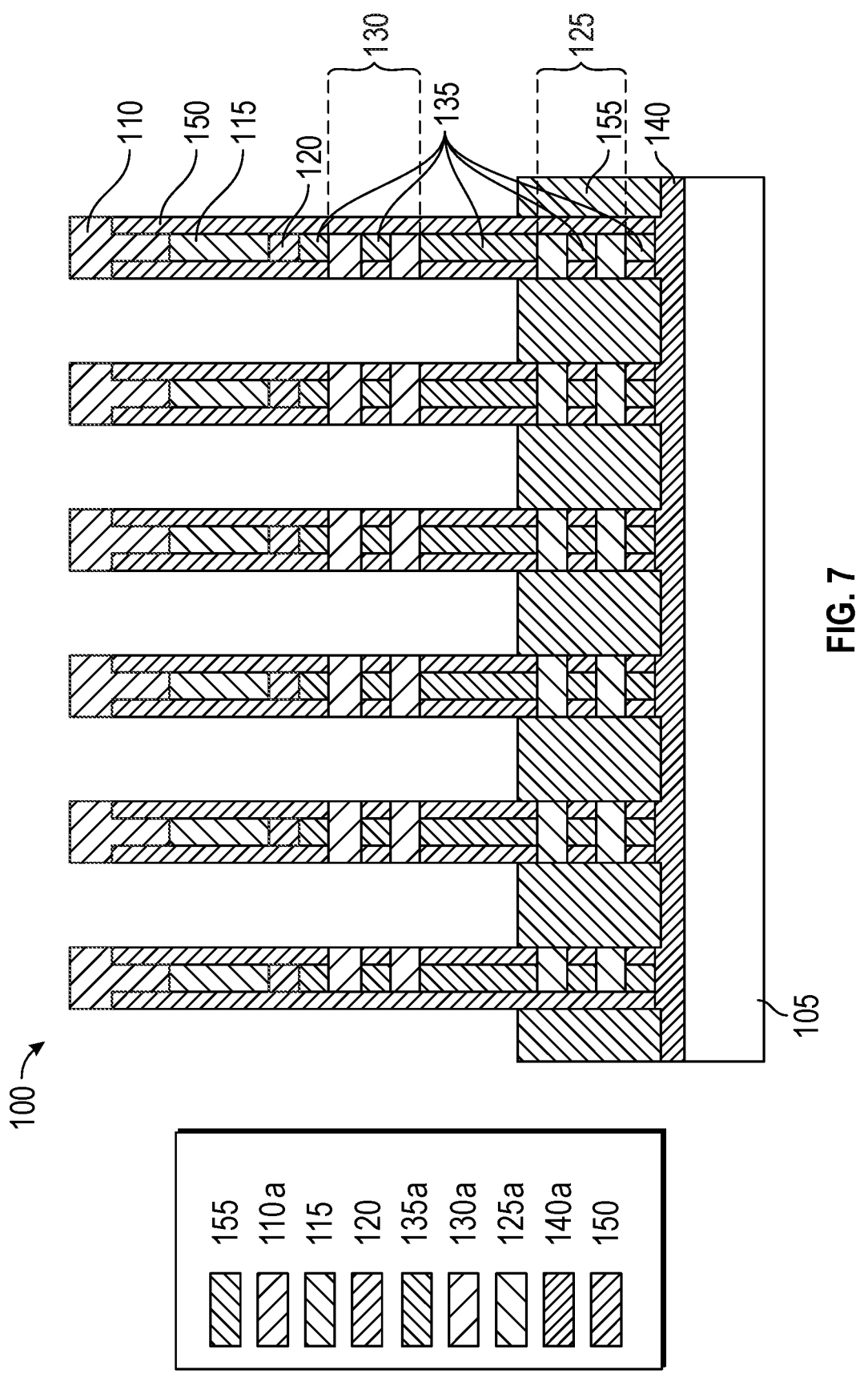
FIG. 7 is a cross-sectional view of a nano-sheet stack after removing a portion of a dielectric, according to an embodiment of the present disclosure.

FIG. 7 is a cross-sectional view of the nano-sheet stack 100 after removing a portion of the dielectric 155, according to an embodiment of the present disclosure. In an embodiment, an etch can be executed to remove the dielectric 155 to uncover the future edges of the p-type first epi region 125.

Figure 8:
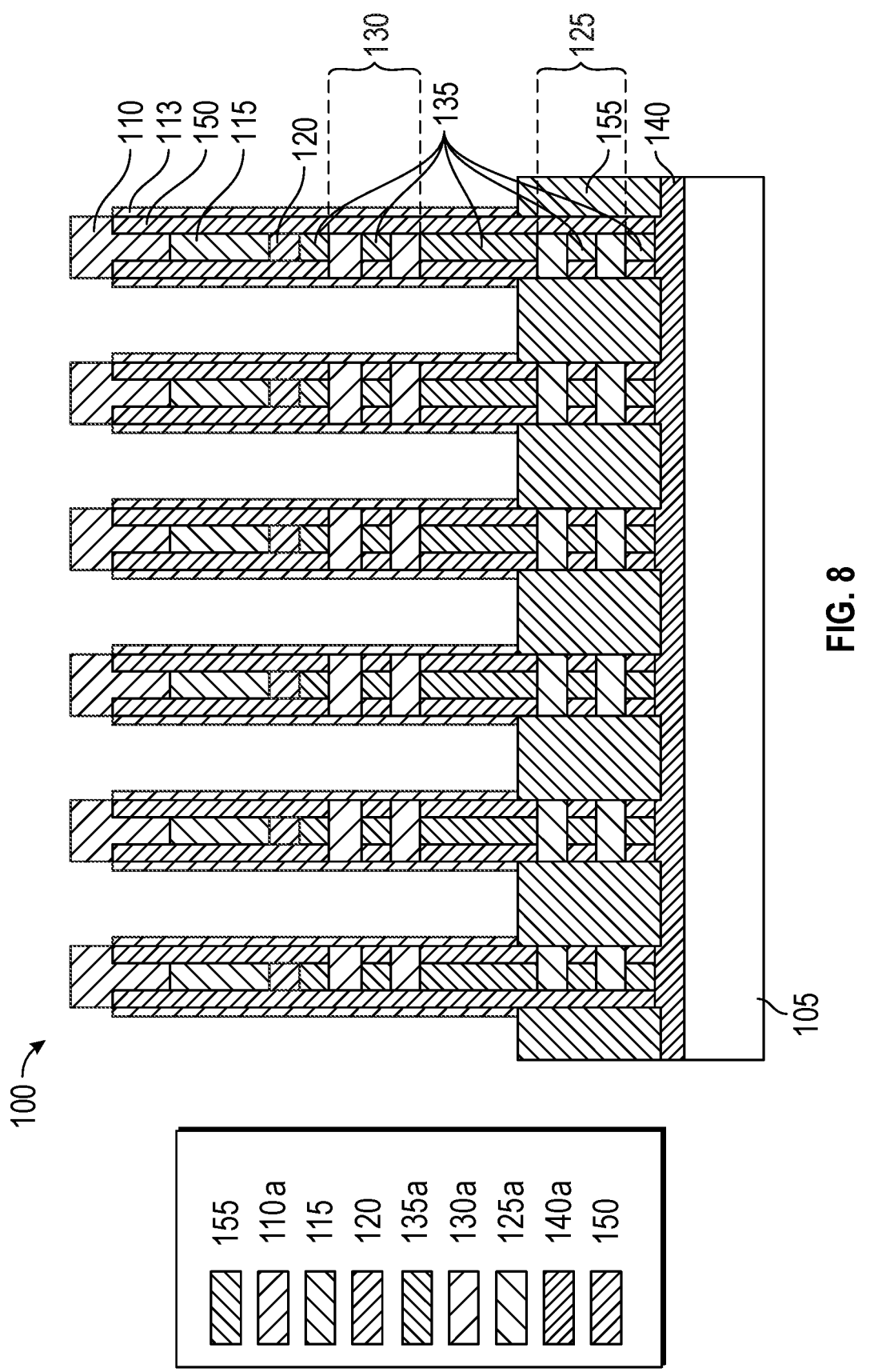
FIG. 8 is a cross-sectional view of a nano-sheet stack after adding a spacer, according to an embodiment of the present disclosure.

FIG. 8 is a cross-sectional view of the nano-sheet stack 100 after adding a spacer, according to an embodiment of the present disclosure. In an embodiment, a nitride spacer 113 can be deposited and etched to protect the n-type second epi region 130.

Figure 9:
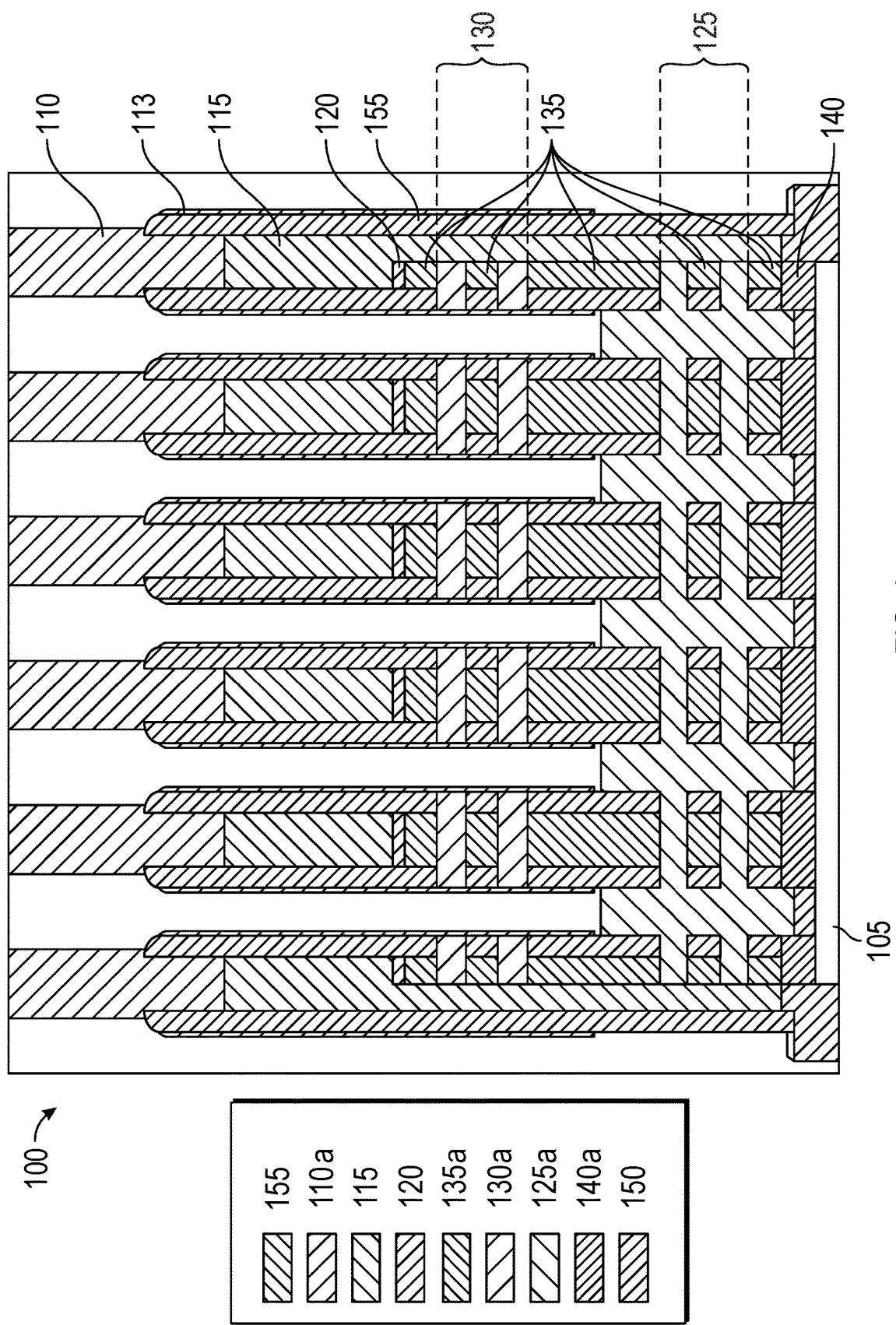
FIG. 9 is a cross-sectional view of a nano-sheet stack after growth of a first epi region, according to an embodiment of the present disclosure.

FIG. 9 is a cross-sectional view of the nano-sheet stack 100 after growth of the first epi region 125, according to an embodiment of the present disclosure. In an embodiment, the first epi material 125a, such as SiGeB or SiB, can be grown from the first epi region 125. As shown, two adjacent S/D regions of the first epi region 125 can be connected. Alternatively, the adjacent S/D regions of the first epi region 125 can be grown/extended but not connected.

Figure 10:
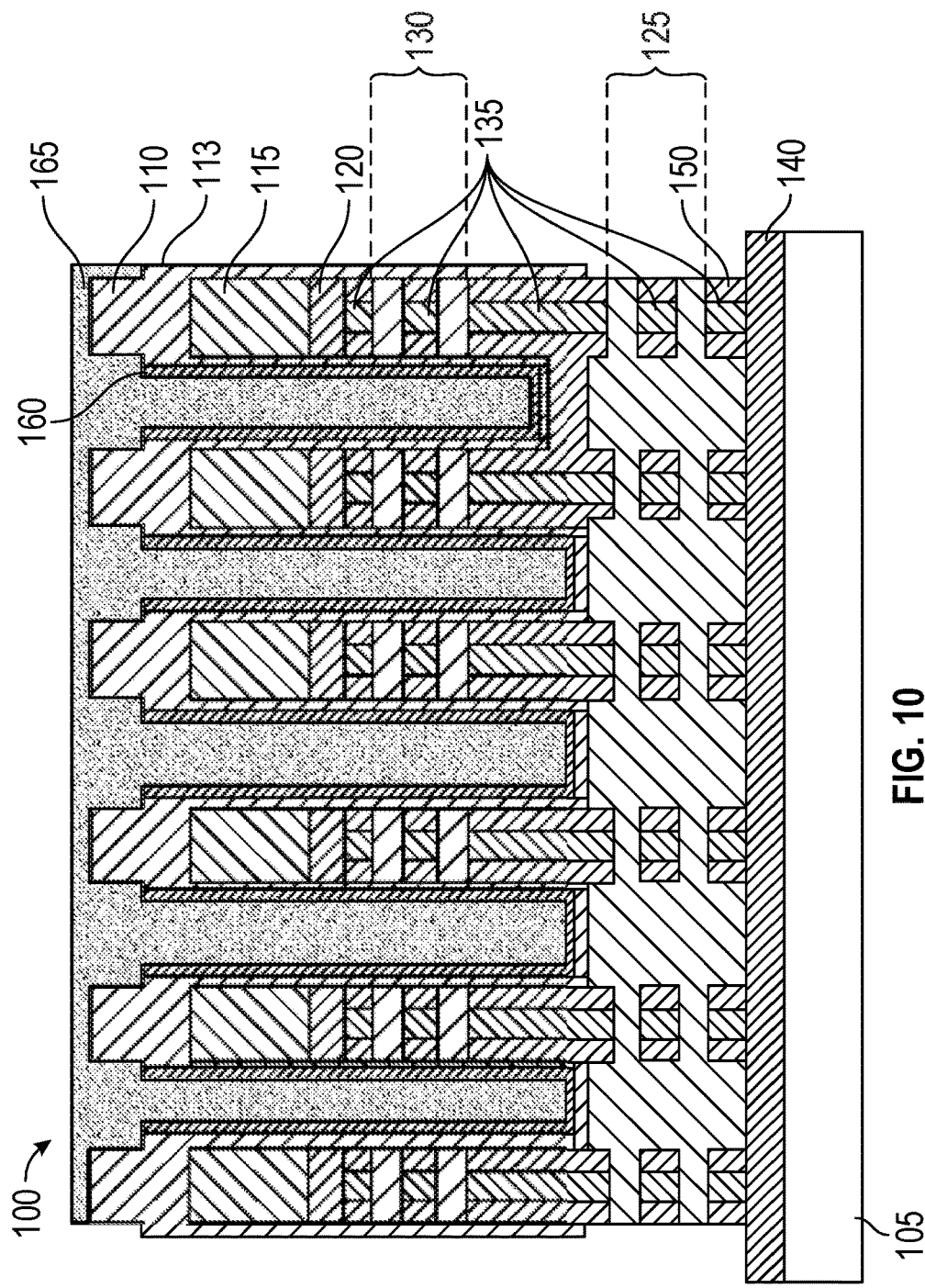
FIG. 10 is a cross-sectional view of a nano-sheet stack after metal deposition, according an embodiment of the present disclosure.

FIG. 10 is a cross-sectional view of the nano-sheet stack 100 after metal deposition, according an embodiment of the present disclosure. In an embodiment, local interconnects can be inserted between the first epi region 125 and the second epi region 130. A selective deposition of Ti 157 can be deposited on the first epi region 125, followed by deposition of a TiN liner 160 and deposition of Ru 165 to fill in the TiN liner 160.

Figure 11:
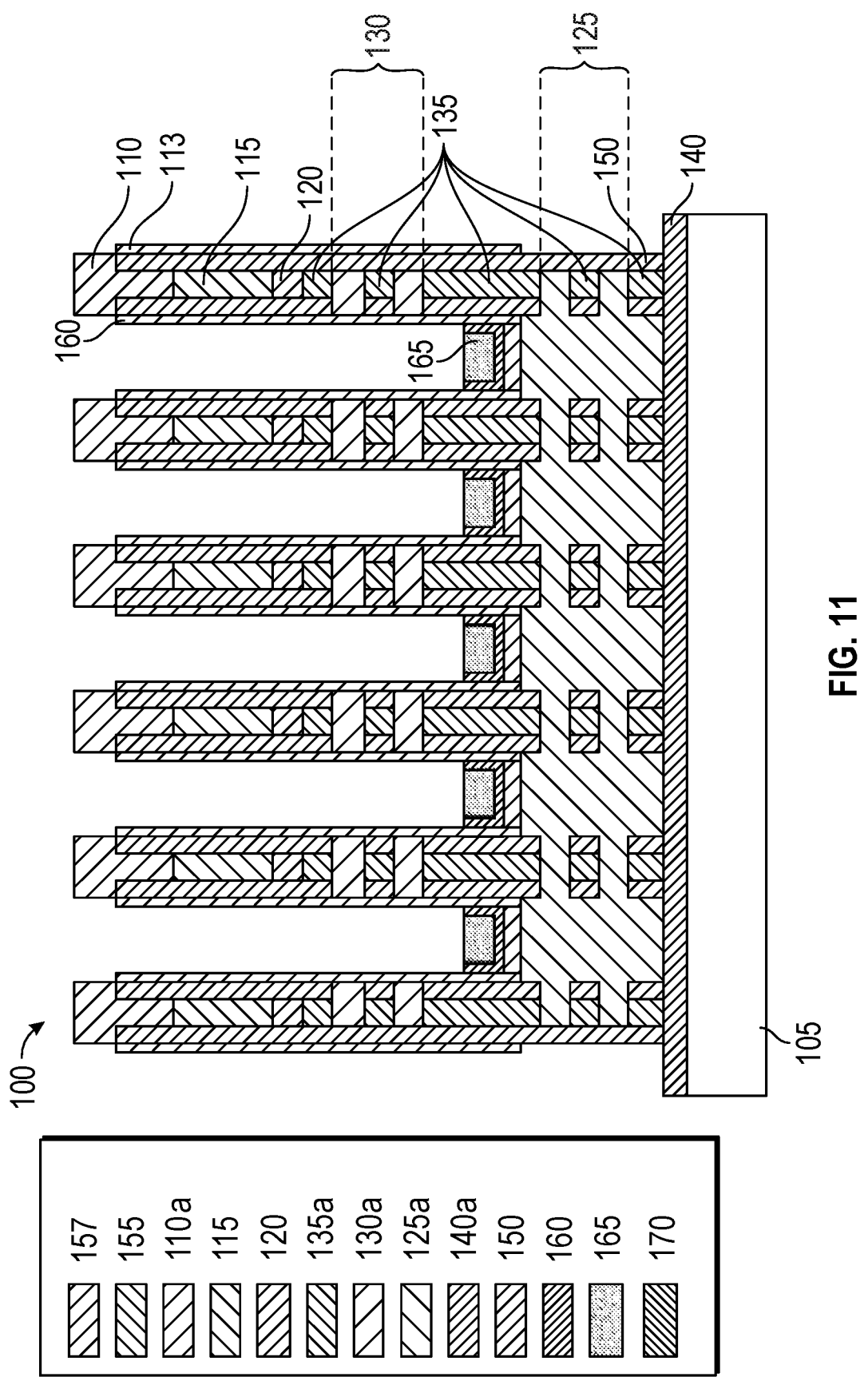
FIG. 11 is a cross-sectional view of a nano-sheet stack after etching, according to an embodiment of the present disclosure.

FIG. 11 is a cross-sectional view of the nano-sheet stack 100 after etching, according to an embodiment of the present disclosure. In an embodiment, the TiN liner 160 and the Ru 165 can be etched down to below the second epi region 130.

Figure 12:
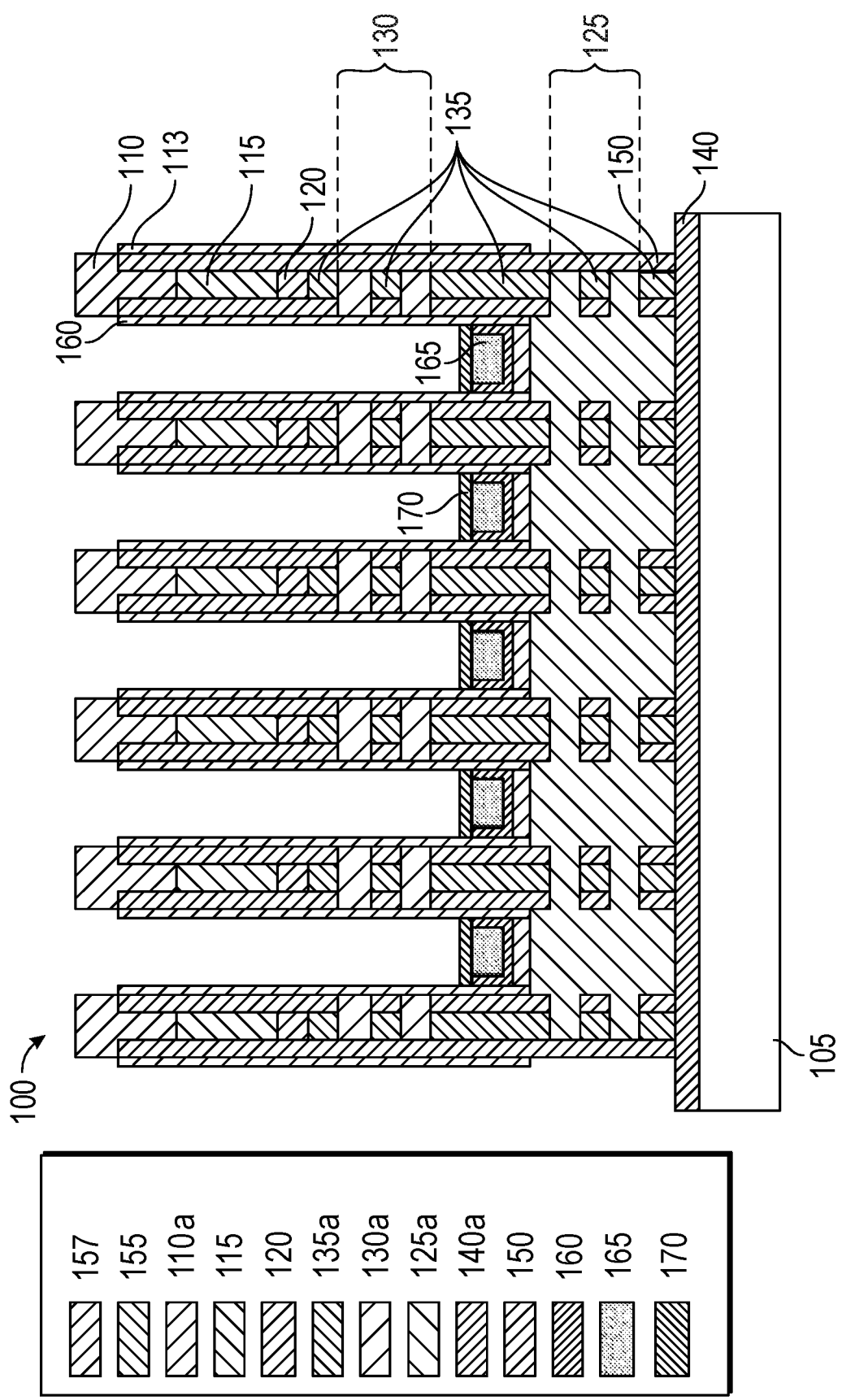
FIG. 12 is a cross-sectional view of a nano-sheet stack after additional deposition, according to an embodiment of the present disclosure.

FIG. 12 is a cross-sectional view of the nano-sheet stack 100 after additional deposition, according to an embodiment of the present disclosure. In an embodiment, aluminum oxide (AlO) 170 can be deposited and a CMP can be executed to cover the Ru 165 with the AlO 170.

Figure 13:
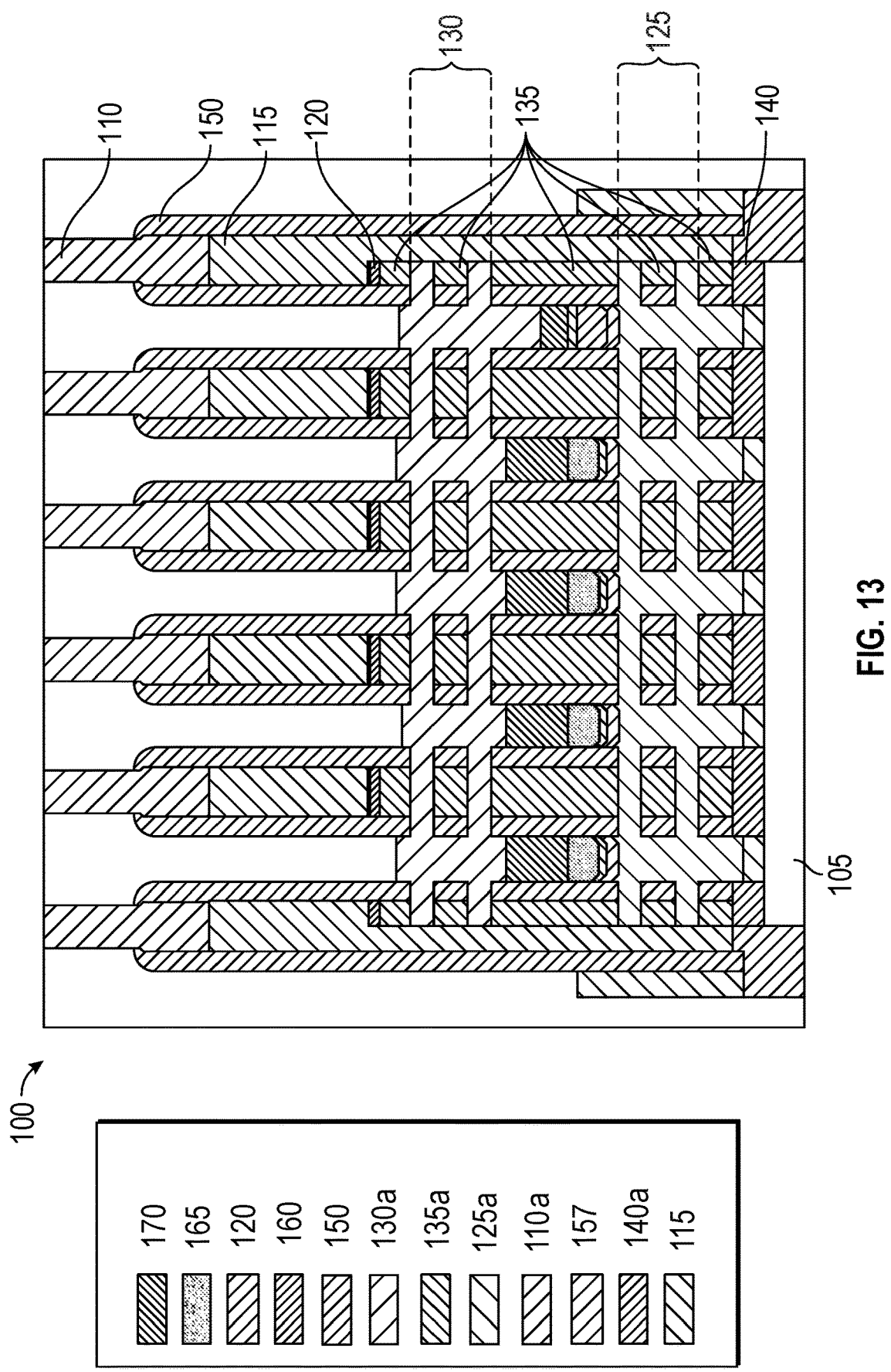
FIG. 13 is a cross-sectional view of a nano-sheet stack after growth of a second epi region, according to an embodiment of the present disclosure.

FIG. 13 is a cross-sectional view of the nano-sheet stack 100 after growth of the second epi region 130, according to an embodiment of the present disclosure. In an embodiment, the nitride spacers 113 can be removed to uncover the n-type second epi region 130. The second epi material 130a, such as Si doped with phosphorous or SiP, can be grown from the second epi region 130. As shown, two adjacent S/D regions of the second epi region 130 can be connected. Alternatively, the adjacent S/D regions of the first epi region 125 can be grown/extended but not connected.

FIG. 14 is a cross-sectional view of the nano-sheet stack 100 after channel release, according to an embodiment of the present disclosure. In an embodiment, the bulk fin layers 135 can be removed to release the first epi region 125 and the second epi region 130.

Figure 15:
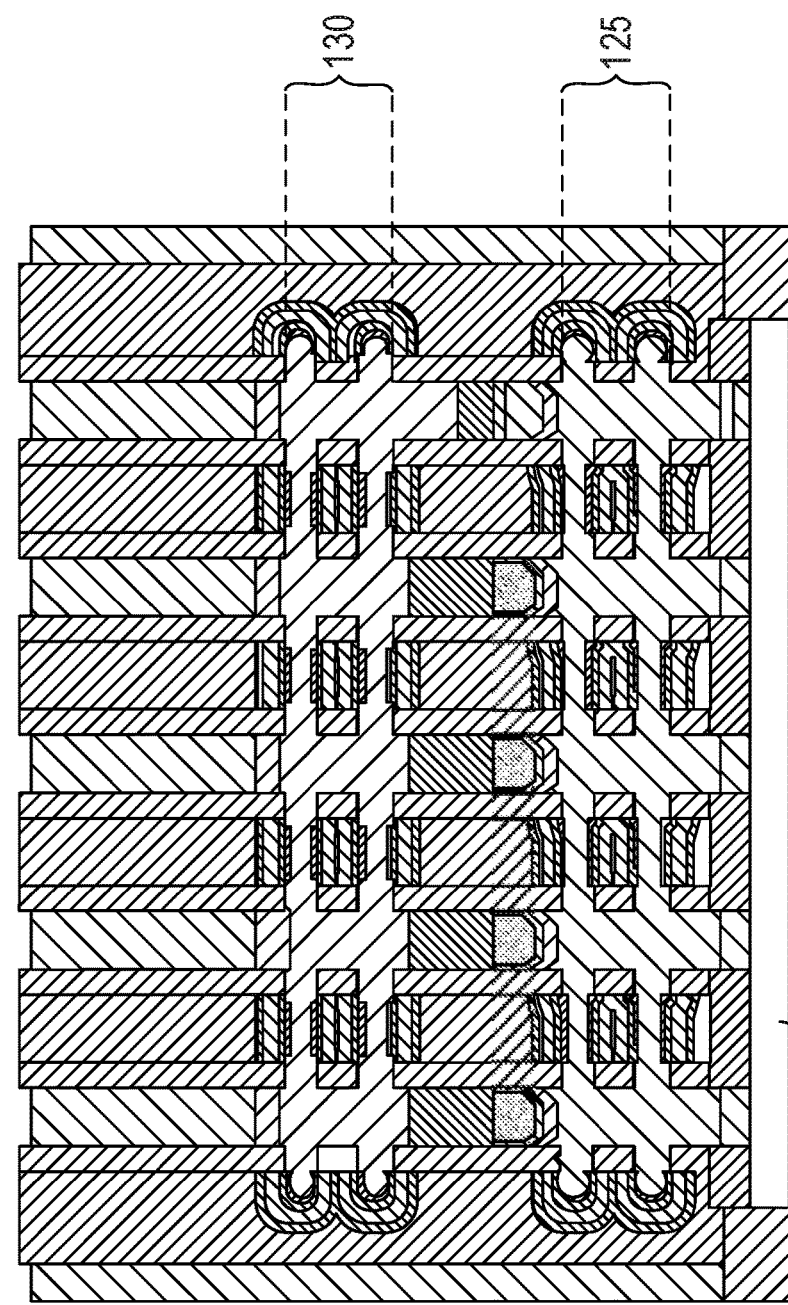
FIG. 15 is a cross-sectional view of a nano-sheet stack during gate formation, according to an embodiment of the present disclosure.

FIG. 15 is a cross-sectional view of the nano-sheet stack 100 during gate formation, according to an embodiment of the present disclosure. In an embodiment, a gate stack can be formed by depositing a high k material and metals for PMOS, such as TiN, TaN, and TiAl. The order of the metal deposition can be performed in a different sequence.

Figure 16:
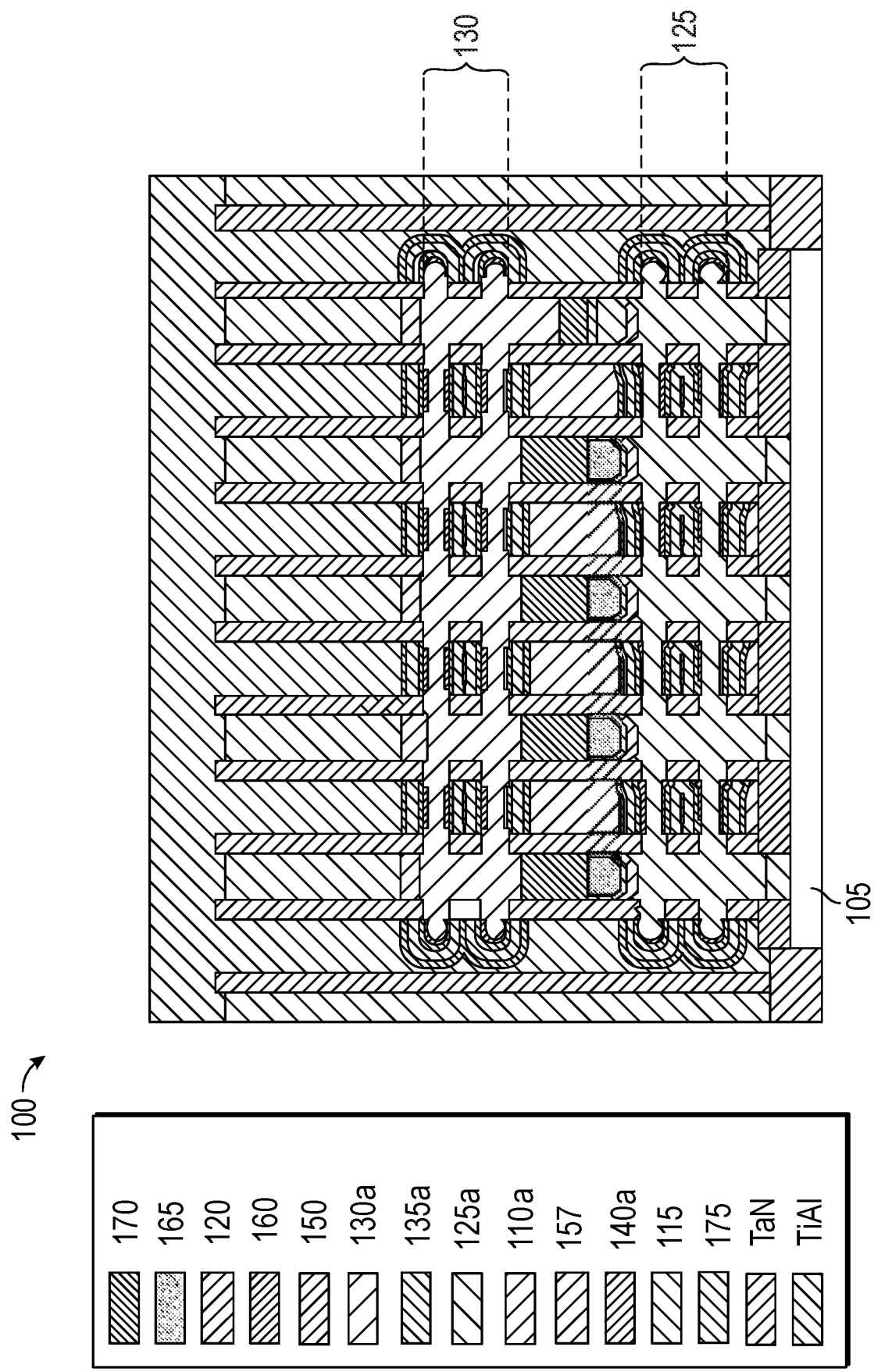
FIG. 16 is a cross-sectional view of a nano-sheet stack after deposition, according to an embodiment of the present disclosure.

FIG. 16 is a cross-sectional view of the nano-sheet stack 100 after deposition, according to an embodiment of the present disclosure. In an embodiment, an organic planarization layer (OPL) 175 can be deposited.

FIG. 17 is a cross-sectional view of the gate stack, according to an embodiment of the present disclosure. In an embodiment, as shown, FIG. 17 shows the gate stack with the metal layers surrounding the high k gate dielectric. This may be a gate all around (GAA) device, so the deposition can be a 360 degree deposition. Note that the final desired metal electrode gate stack for PMOS can be a complete stack of TiN, TaN, and TiAl, and for NMOS it can be a partial stack of TiN and TaN with the TiAl removed in a later step.

Figure 18:
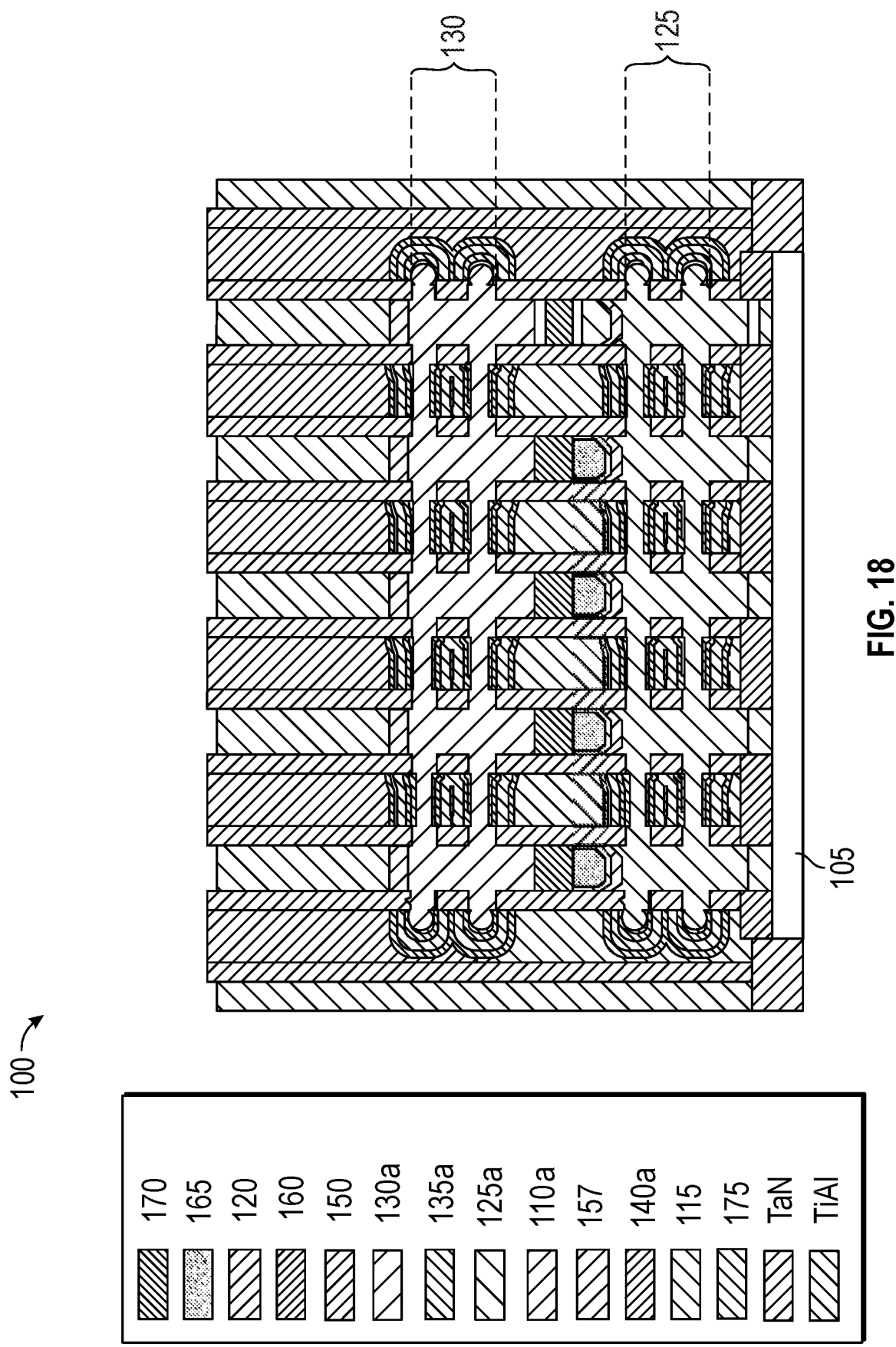
FIG. 18 is a cross-sectional view of a nano-sheet stack after etching, according to an embodiment of the present disclosure.

FIG. 18 is a cross-sectional view of the nano-sheet stack 100 after etching, according to an embodiment of the present disclosure. In an embodiment, the OPL 175 can be recessed, such as by etching, to uncover the NMOS devices in the second epi region 130. This allows subsequent etching of the TiAl and the OPL 175 to enable the NMOS devices in the second epi region 130.

Figure 19:
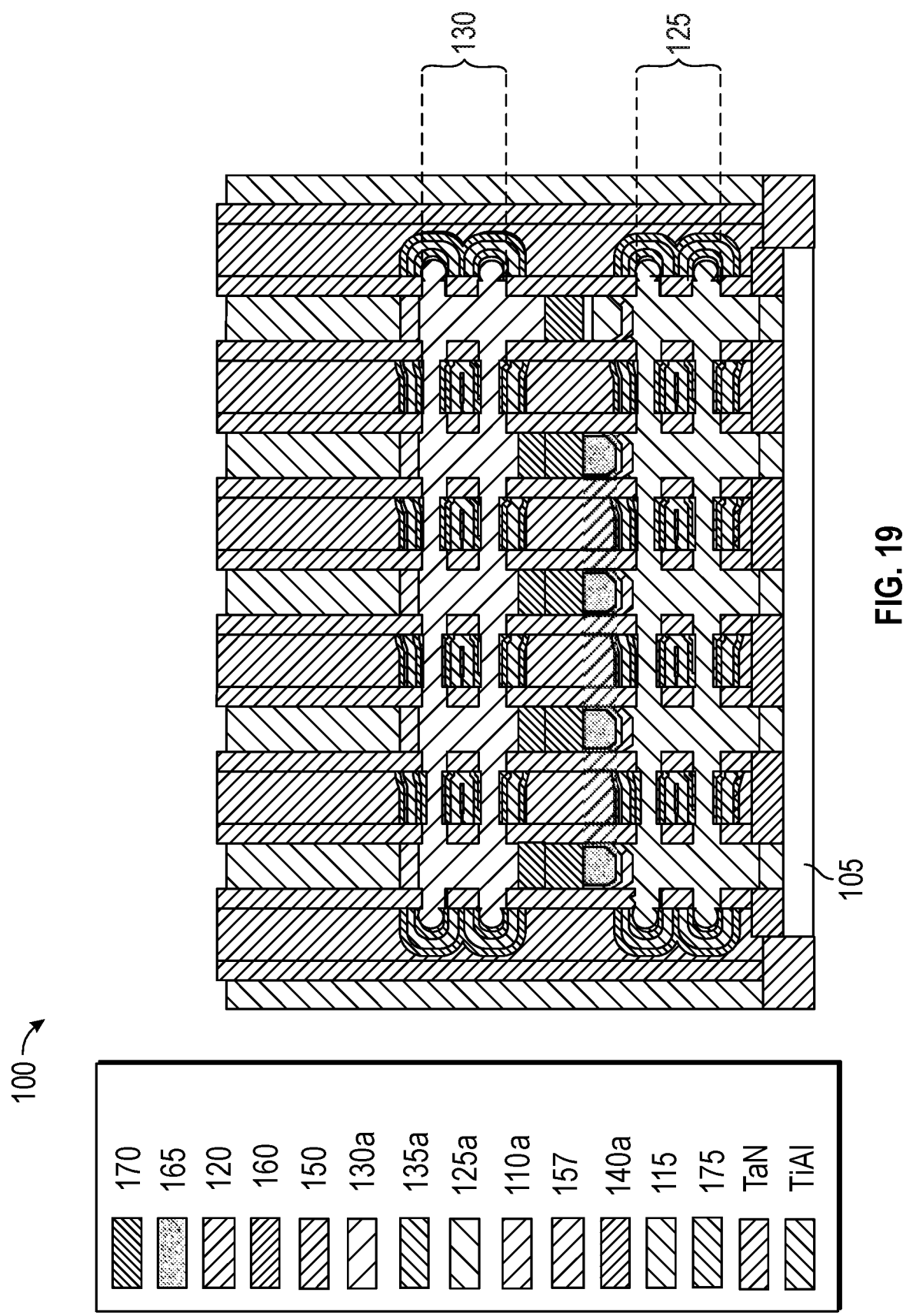
FIG. 19 is a cross-sectional view of a nano-sheet stack after additional etching, according to an embodiment of the present disclosure.

FIG. 19 is a cross-sectional view of the nano-sheet stack 100 after additional etching, according to an embodiment of the present disclosure. In an embodiment, the TiAl metal can be etched and the OPL 175 can be removed to enable the NMOS devices in the second epi region 130.

FIG. 20 is a cross-sectional view of the gate stack after TiAl removal, according to an embodiment of the present disclosure. In an embodiment, the TiAl can be removed from the NMOS metal electrode gate stacks. Thus, the final desired metal electrode gate stacks are obtained for PMOS (complete stack of TiN, TaN, and TiAl) and NMOS (partial stack of TiN and TaN).

Figure 21:
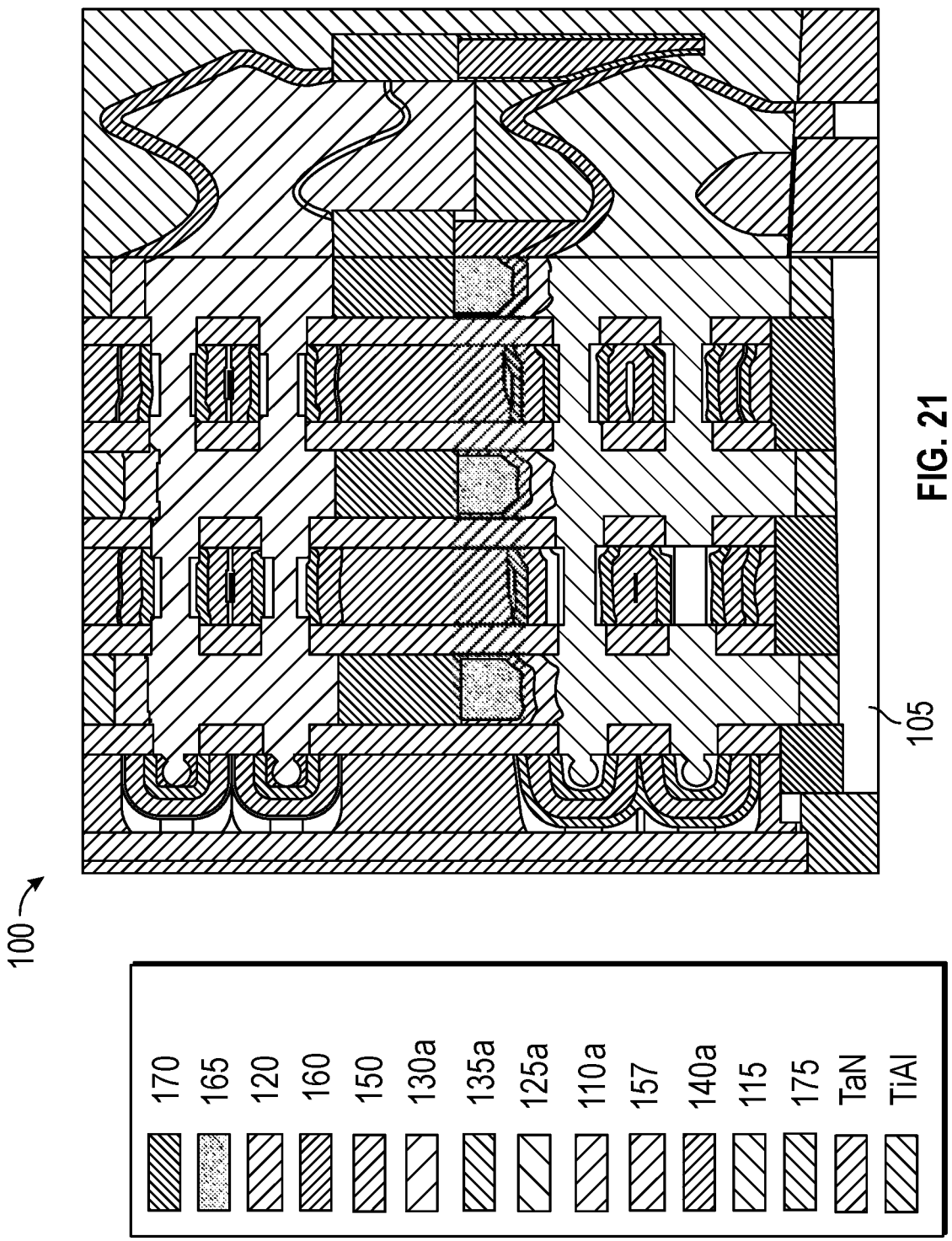
FIG. 21 is a 3D sectional view of a completed 3D CMOS stack with integrated channel and S/D regions, according to an embodiment of the present disclosure.

FIG. 21 is a 3D sectional view of a completed 3D CMOS stack with integrated channel and S/D regions, according to an embodiment of the present disclosure. In an embodiment, metal rails can be routed through the 3D CMOS stack to complete device connections.

Figure 22:
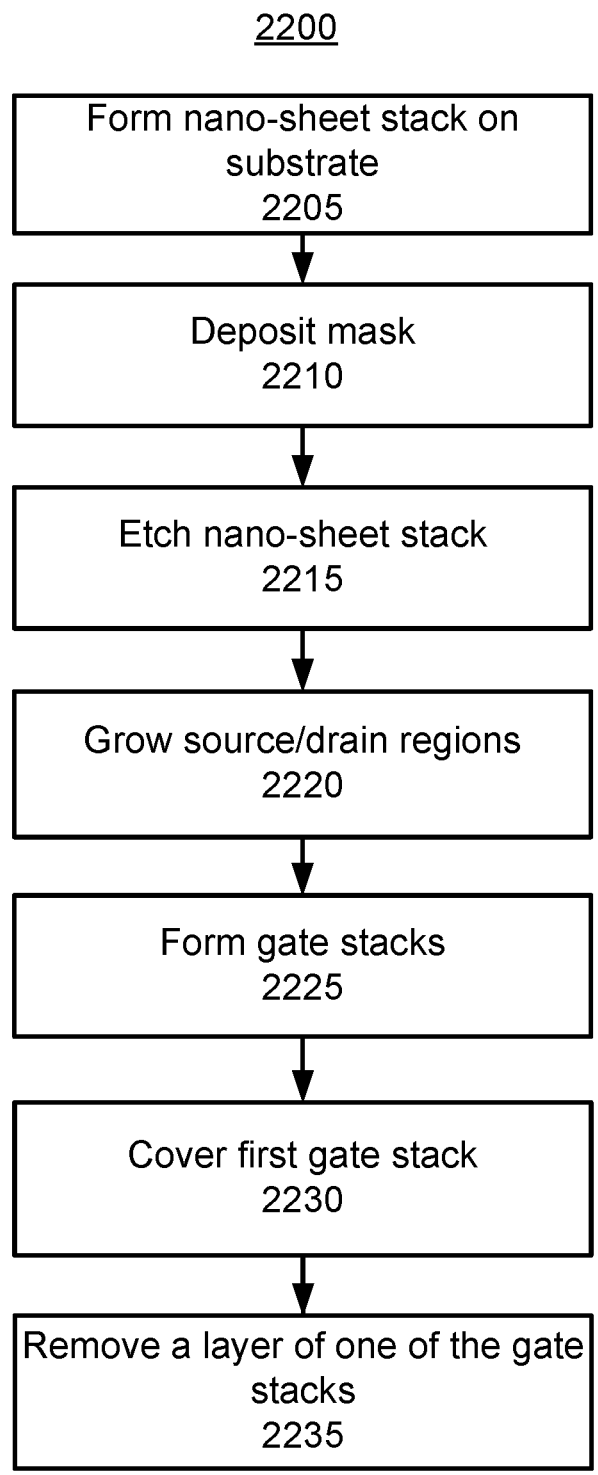
FIG. 22 is a flow chart for a method of fabricating a semiconductor device, according to an embodiment of the present disclosure.

FIG. 22 is a flow chart for a method 2200 of fabricating a semiconductor device, according to an embodiment of the present disclosure. In step 2205, the nano-sheet stack 100 is formed on a surface of the substrate 105, the nano-sheet stack 100 including: i) the first epi region 125 formed from the first epi material 125a and disposed proximal to the substrate 105, the first epi material 125a being doped with a first dopant, and the first epi region 125 including at least one layer of the first epi material 125a, ii) the second epi region 130 formed from the second epi material 130a and disposed vertically above the first epi region 125, the second epi material 130a being doped with a second dopant, and the second epi region 130 including at least one layer of the second epi material 130a, and the bulk fin layers 135 formed from the bulk fin material 135a and disposed between the first epi region 125 and the second epi region 130. In step 2210, the mask 145 is deposited overtop the nano-sheet stack 100. In step 2215, the nano-sheet stack 100 is etched to form the multilayer sub-stacks defined by the mask 145. In step 2220, the source/drain regions are grown at the ends of the first epi material 125a in the first epi region 125 and the second epi material 130b in the second epi region 130. In step 2225, the gate stacks are formed on the source/drain regions. In step 2230, a first gate stack of the gate stacks is covered with a fill material. In step 2235, at least one layer of the gate stacks is removed.

Example embodiments have been described with reference to the drawings. Note that N=4 nano-sheets are shown in the example with NMOS over PMOS. Any number greater than four nano-sheets can be selected in other embodiments. Arrangement of the NMOS and PMOS can be altered in other embodiments. The described method significantly reduces process steps implemented to make 3D CMOS and 3D logic. Furthermore, because the channel and S/D are the same material, this method enables channel scaling. Accordingly, methods herein enable higher density circuits to be produced at reduced cost. 3D devices are provided having a low SS and Idoff, robust IDsat and good Vt control. N+ channel and N+ S/D regions can be grown epitaxially and obtained by a same nano-sheet for NMOS devices. P+ channel and P+ S/D regions can be grown epitaxially and obtained by a same nano-sheet for PMOS devices. A CFET stack can be used with a new transistor architecture. Higher performance circuits are now possible with techniques described herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Embodiments of the present disclosure may also be as set forth in the following parentheticals.

(1) A method of fabricating a semiconductor device, comprising: forming a nano-sheet stack on a surface of a substrate, the nano-sheet stack including a first portion formed from a first channel material and disposed proximal to the substrate, the first channel material being doped with a first dopant, and the first portion including at least one layer of the first channel material, a second portion formed from a second channel material and disposed vertically above the first portion, the second channel material being doped with a second dopant, and the second portion including at least one layer of the second channel material, and a bulk portion formed from a bulk material and disposed between the first portion and the second portion; depositing a mask overtop the nano-sheet stack; etching the nano-sheet stack to form multilayer sub-stacks defined by the mask, each stack of the multilayer sub-stacks including the first portion having uncovered sidewalls of the first channel material and the second portion having uncovered sidewalls of the second channel material; growing a first source/drain region at ends of the first channel material in the first portion, the first source/drain region being doped based on the first dopant; and growing a second source/drain region at ends of the second channel material in the second portion, the second source/drain region being doped based on the second dopant.

(2) The method of (1), wherein the first dopant of the first channel material is p-type and the second dopant of the second channel material is n-type.

(3) The method of either (1) or (2), wherein the p-type doped first channel material and the p-type doped first source/drain region have a common doping level, and the n-type doped second channel material and the n-type doped second source/drain region have a common doping level.

(4) The method of any one of (1) to (3), wherein a first source/drain region material is the same as the first channel material, and a second source/drain region material is the same as the second channel material.

(5) The method of any one of (1) to (4), wherein the first source/drain region in the first portion is grown from the first channel material in the first portion and the second source/drain region in the second portion is grown from the second channel material in the second portion.

(6) The method of any one of (1) to (5), wherein a first source/drain region material is different from the first channel material, and a second source/drain region material is different from the second channel material.

(7) The method of any one of (1) to (6), wherein the step of growing the first source/drain region in the first portion further comprises: stopping growth of the first source/drain region before adjacent source/drain regions of the first source/drain region expand to come in contact with one another.

(8) The method of any one of (1) to (7), further comprising: forming a first gate stack on the first source/drain region, the first gate stack including at least one layer of a first gate material; forming a second gate stack on the second source/drain region, the second gate stack including at least one layer of a second gate material; and removing a layer of the at least one layer of the second gate material of the second gate stack.

(9) The method of any one of (1) to (8), wherein the step of forming a first gate stack on the first source/drain region further comprises: depositing a high k material and metals for a PMOS transistor.

(10) The method of any one of (1) to (9), wherein the step of removing a layer of the at least one layer of the second gate material of the second gate stack further comprises: covering the first gate stack on the first source/drain region.

(11) The method of (8), wherein the metals deposited are a layer each of TiN, TaN, and TiAl.

(12) The method of (11), wherein the layer of the at least one layer of the first gate material that is removed is the TiAl metal layer.

(13) The method of any one of (1) to (12), wherein less than four layers of the metals are deposited, and the metals deposited are a titanium compound or a tantalum compound.

(14) The method of any one of (1) to (13), wherein the layer of the at least one layer of the first gate material that is removed is a titanium compound metal layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, comprising:
    forming a nano-sheet stack on a surface of a substrate, the nano-sheet stack including
        a first portion formed from a first channel material and disposed proximal to the substrate, the first channel material being doped with a first dopant, and the first portion including at least one layer of the first channel material,
        a second portion formed from a second channel material and disposed vertically above the first portion, the second channel material being doped with a second dopant, and the second portion including at least one layer of the second channel material, and
        a bulk portion formed from a bulk material and disposed between the first portion and the second portion;
    etching the nano-sheet stack to form multilayer sub-stacks, each stack of the multilayer sub-stacks including the first portion having uncovered sidewalls of the first channel material and the second portion having uncovered sidewalls of the second channel material;
    covering the uncovered sidewalls of the second channel material in the second portion;
    growing a first source/drain region in the first portion, the first source/drain region being doped based on the first dopant;
    uncovering the covered sidewalls of the second channel material in the second portion; and
    growing a second source/drain region in the second portion, the second source/drain region being doped based on the second dopant.

2. The method of claim 1, wherein the first dopant of the first channel material is p-type and the second dopant of the second channel material is n-type.

3. The method of claim 2, wherein the p-type doped first channel material and the p-type doped first source/drain region have an equal concentration of dopant, and the n-type doped second channel material and the n-type doped second source/drain region have an equal concentration of dopant.

4. The method of claim 1, wherein a first source/drain region material is the same as the first channel material, and a second source/drain region material is the same as the second channel material.

5. The method of claim 1, wherein the first source/drain region in the first portion is grown from the first channel material in the first portion and the second source/drain region in the second portion is grown from the second channel material in the second portion.

6. The method of claim 1, wherein the step of growing the first source/drain region in the first portion further comprises:
    stopping growth of the first source/drain region before adjacent source/drain regions of the first source/drain region expand to come in contact with one another.

7. The method of claim 1, further comprising:
    forming a first gate stack on the first channel material, the first gate stack including at least one layer of a first gate material;
    forming a second gate stack on the second channel material, the second gate stack including at least one layer of a second gate material; and
    removing a layer of the at least one layer of the second gate material of the second gate stack.

8. The method of claim 7, wherein
    the step of forming a first gate stack on the first channel material further comprises depositing a high k material and metals for a PMOS transistor, and
    the step of removing a layer of the at least one layer of the second gate material of the second gate stack further comprises covering the first gate stack on the first channel material.

9. The method of claim 1, wherein covering the uncovered sidewalls of the second channel material in the second portion further comprises
    depositing a protective fill to cover the uncovered sidewalls of the first channel material in the first portion;
    depositing a protective layer over the uncovered sidewalls of the second channel material in the second portion; and removing the protective fill to uncover the covered sidewalls of the first channel material in the first portion.

10. The method of claim 1, wherein
the step of etching the nano-sheet stack to form multilayer sub-stacks forms a first sub-stack, a second sub-stack separated from the first sub-stack by a first gap, and a third sub-stack separated from the second sub-stack by a second gap, and
the step of growing the first source/drain region in the first portion further comprises growing the first source/drain region in between adjacent sub-stack to form a first common source/drain region bridging the first channel material of the first sub-stack and the first channel material of the second sub-stack and a second common source/drain region bridging the first channel material of the second sub-stack and the first channel material of the third sub-stack, the first common source/drain region being electrically connected to the second common source/drain region.

11. A method of fabricating a semiconductor device, comprising:
forming a nano-sheet stack on a surface of a substrate, the nano-sheet stack including
a first portion formed from a first channel material and disposed proximal to the substrate, the first channel material being doped with a first dopant, and the first portion including at least one layer of the first channel material,
a second portion formed from a second channel material and disposed vertically above the first portion, the second channel material being doped with a second dopant, and the second portion including at least one layer of the second channel material, and
a bulk portion formed from a bulk material and disposed between the first portion and the second portion;
depositing a mask overtop the nano-sheet stack;
etching the nano-sheet stack to form multilayer sub-stacks defined by the mask, each stack of the multilayer sub-stacks including the first portion having uncovered sidewalls of the first channel material and the second portion having uncovered sidewalls of the second channel material;
growing a first source/drain region at ends of the first channel material in the first portion, the first source/drain region being doped based on the first dopant;
growing a second source/drain region at ends of the second channel material in the second portion, the second source/drain region being doped based on the second dopant;
forming a first gate stack on the first source/drain region at ends of the first channel material in the first portion, the first gate stack including at least one layer of a first gate material;
forming a second gate stack on the second source/drain region at ends of the second channel material in the second portion, the second gate stack including at least one layer of a second gate material;
depositing an organic planarization layer to at least cover the first gate stack on the first source/drain region; and
recessing the organic planarization layer to uncover the second gate stack on the second source/drain region.

12. The method of claim 11, wherein the first dopant of the first channel material is p-type and the second dopant of the second channel material is n-type.

13. The method of claim 12, wherein the p-type doped first channel material and the p-type doped first source/drain region have a common doping level, and the n-type doped second channel material and the n-type doped second source/drain region have a common doping level.

14. The method of claim 11, wherein a first source/drain region material is the same as the first channel material, and a second source/drain region material is the same as the second channel material.

15. The method of claim 1, wherein the first source/drain region in the first portion is grown from the first channel material in the first portion and the second source/drain region in the second portion is grown from the second channel material in the second portion.

16. The method of claim 11, wherein a first source/drain region material is different from the first channel material, and a second source/drain region material is different from the second channel material.

17. The method of claim 11, wherein the step of growing the first source/drain region in the first portion further comprises:
stopping growth of the first source/drain region before adjacent source/drain regions of the first source/drain region expand to come in contact with one another.

18. The method of claim 11, wherein the step of forming a first gate stack on the first source/drain region further comprises:
depositing a high k material and metals for a PMOS transistor.

19. The method of claim 18, wherein the step of removing a layer of the at least one layer of the second gate material of the second gate stack further comprises:
covering the first gate stack on the first source/drain region.

20. The method of claim 11, further comprising:
removing a layer of the at least one layer of the second gate material of the second gate stack.

* * * * *